United States Patent
Hsieh

(10) Patent No.: US 7,816,732 B2
(45) Date of Patent: Oct. 19, 2010

(54) INTEGRATED TRENCH MOSFET AND SCHOTTKY RECTIFIER WITH TRENCH CONTACT STRUCTURE

(75) Inventor: Fu-Yuan Hsieh, Hsingchu (TW)

(73) Assignee: Force MOS Technology Co., Ltd., Hsinchu (TW)

( * ) Notice: Subject to any disclaimer, the term of this patent is extended or adjusted under 35 U.S.C. 154(b) by 18 days.

(21) Appl. No.: 12/213,628

(22) Filed: Jun. 23, 2008

(65) Prior Publication Data

US 2009/0315106 A1   Dec. 24, 2009

(51) Int. Cl.
*H01L 29/66* (2006.01)
(52) U.S. Cl. .............................. 257/334; 257/E27.081
(58) Field of Classification Search ................. 257/333, 257/334
See application file for complete search history.

(56) References Cited

U.S. PATENT DOCUMENTS

| 2003/0040144 | A1* | 2/2003 | Blanchard et al. ........... 438/145 |
| 2005/0029585 | A1* | 2/2005 | He et al. ...................... 257/330 |
| 2006/0125040 | A1* | 6/2006 | Levin et al. .................. 257/471 |
| 2006/0170036 | A1* | 8/2006 | Yilmaz ........................ 257/329 |
| 2008/0246082 | A1* | 10/2008 | Hshieh ......................... 257/333 |

* cited by examiner

*Primary Examiner*—Jarrett J Stark
*Assistant Examiner*—Lawrence Tynes, Jr.
(74) *Attorney, Agent, or Firm*—Bacon & Thomas, PLLC

(57) ABSTRACT

A trench MOSFET in parallel with trench Schottky barrier rectifier is formed on a single substrate. The present invention solves the constrains brought by planar contact of Schottky, for example, the large area occupied by planar structure. As the size of present device is getting smaller and smaller, the trench Schottky structure of this invention is able to be shrink and, at the same time, to achieve low specific on-resistance. By applying a double epitaxial layer in trench Schottky barrier rectifier, the device performance is enhanced for lower Vf and lower reverse leakage current Ir is achieved.

12 Claims, 7 Drawing Sheets

INTEGRATED TRENCH MOSFET AND SCHOTTKY RECTIFIER WITH TRENCH CONTACT STRUCTURE

BACKGROUND OF THE INVENTION

1. Field of the Invention

This invention relates generally to integrated circuits comprising power MOSFETs in parallel with Schottky rectifiers. More particularly, this invention relates to a novel and improved structure and improved process of fabricating an integrated trench MOSFET and Schottky rectifier with trench contact structure upon a single substrate, which structure has improved performance with low specific on-resistance for Trench MOSFET and low Vf and reverse leakage current Ir for Trench Schottky rectifier, as well as low fabricating cost.

2. The Prior Arts

The Shottky barrier rectifiers have been used in DC-DC converters. In parallel with the parasitic PN body diode, the Schottky barrier rectifier acts as clamping diode to prevent the body diode from turning on for the reason of higher speed and efficiency, so the recent interests have been focus on the technology to integrate the MOSFET and the Schottky barrier rectifier on a single substrate. In U.S. Pat. Nos. 6,351,018, 6,987,305 and 6,593,620, methods of forming the Schottky diode on the same substrate with MOSFET are disclosed.

To integrate the MOSFET device and the Schottky barrier rectifier upon a single substrate, the Schottky structures used in U.S. Pat. Nos. 6,351,018 and 6,987,305 are designed to share the same trench gate with trench MOSFET. And one of the structures is shown in FIG. 1. An integrated trench MOSFET-Schottky diode structure is fabricated on a substrate 202 of a first doping type, into which a plurality of trenches 200 are etched. A thin layer of insulator 204 lines the sidewalls of the trenches 200, and after which the trenches 200 are filled with conductive material 206 to act as gate material. Then the well region of a second doping type is formed by diffusion between trenches except those where Schottky diode will be formed (trenches 200-3 and 200-4, as shown). After the P-well formation, source regions 212 are diffused at the surface of the substrate, followed by the formation of P+ body region 214 inside each P-well region. In order to distinguish the conductive layers playing different roles, 216 is marked to figure the connecting layer to source region 212, while 218 figures the anode of Schottky diode 210 as illustrated. And metal layer 220 is deposited to short the source region 212 and anode of Schottky diode 210.

Another integrating method is introduced in U.S. Pat. No. 6,593,620 of which trench gate of the Schottky structure is shorted with anode or source metal of the trench MOSFET, as shown in FIG. 2. A combination structure has DMOS transistor devices within DMOS transistor region 220 and has Schottky barrier rectifier devices within rectifier region 222. The entire structure includes, an N+ substrate 200 on which is grown a lightly n-doped epitaxial layer 202, which serves as the drain for the DMOS transistor devices and cathode region for the rectifier devices. Conductive layer 218 is deposited on the rear side of the substrate to act as a common drain contact for the DMOS transistor devices and as a common cathode electrode for the rectifier devices. Inside the epitaxial layer 202, body regions 204 of a second doping type is formed for the DMOS transistor devices, and N+ source regions 212 are also provided. Conductive layer 216 deposited on the front side of the substrate acts as a common source contact for the DMOS transistor devices, shoring the sources with one another, and at the same time, acts as anode electrode for the rectifier devices. Trench regions lined with oxide layers 206 and filled with polysilicon 210 are provided, and polysilicon 210 is shorted to the conductive layer 216 for the rectifier devices. Layer of 214 illustrated is BPSG layer used to insulate the polysilicon 210 from conductive layer 216 for the DMOS transistor devices. It should be noticed that, the Schottky barrier rectifier devices and the DMOS transistor devices in this patent have separated trench gates in contrast to the structure mentioned above.

Both structures in the prior arts introduced can achieve the integration of MOSFET devices and Schottky barrier rectifier devices on a single substrate, but there are still some constrains.

Conventional technologies to form both the Schottky barrier rectifier and trench MOSFET, as described above, are mainly planar contact. First of all, the planar contact occupies a large area, almost one time of MOSFET. As the size of devices is developed to be smaller and smaller, this structure is obviously should replaced by another configuration which will meet the need for size requirement. On the other hand, this planar structure will lead to a device shrinkage limitation since the contacts occupy large area, resulting in high specific on-resistance according to the length dependence of resistance.

Another disadvantage of the structures mentioned in prior arts is that, during the fabricating process, additional P+ mask or contact mask for opening of Schottky rectifier anode contact is required, and therefore need additional fabrication cost.

Accordingly, it would be desirable to provide an integrated trench MOSFET-Schottky barrier rectifier structure having lower on-resistance, lower fabricating cost, and, at the same time, having smaller device area.

SUMMARY OF THE INVENTION

It is therefore an object of the present invention to provide new and improved integrated trench MOSFET-Schottky barrier rectifier device and manufacture process solving the problems mentioned above.

One aspect of the present invention is that, the planar contact for both the MOSFET devices and Schottky barrier rectifier devices are replaced by the trench Schottky structure. By using this structure, the devices are able to be shrunk to achieve low specific on-resistance for trench MOSFET and, at the same time, achieve low Vf and low reverse leakage current for trench Schottky rectifier by applying a double epitaxial layer in a preferred embodiment.

Another aspect of the present invention is that, there's no need to use additional mask to open the anode of Schottky rectifier in fabricating process according to this invention, therefore cost saving is achieved.

Briefly, in a preferred embodiment, the present invention disclosed an integrated device formed on a heavily doped substrate comprising: a trench MOSFET and a trench Schottky rectifier. Said trench MOSFET further comprises a trenched gate surrounded by a source region encompassed in a body region above a drain region disposed on a bottom surface of said substrate; trench contacts filled with tungsten plugs to connect all said source region with a metal of Al Alloys or Copper serving as source metal by a layer of Ti Silicide/TiN or Co Silicide/TiN deposited along the sidewall of each contact trench; a region heavily doped with dopant different from the source dopant underneath said contact trench to further reduce the resistance between said source region and said body region. The trench Schottky rectifier device further comprises: trenched gates penetrating into a drift region built on said substrate; contact trenches and P+ region at the bottom of each contact trench except trenches into trench gates introduced in the same step with those of trench MOSFET; a layer of Ti Silicide/TiN or Co Silicide/TiN along the sidewall of each trench like that of trench MOSFET but acting as the anode of Schottky rectifier; said metal layer along the sidewall of each trench is connect to said layer of Al Alloys or Copper which serving as the source metal in trench MOSFET. What should be noticed is that, integrated trench MOSFET and trench Schottky rectifier use single gate oxide and trench contacts for source of trench MOSFET and anode of Schottky barrier rectifier, and the trench gates in Schottky rectifier is not connected with the trench gate in trench MOSFET but shorted with anode of Schottky barrier rectifier.

Briefly, in another preferred embodiment, the structure disclosed is the same as structure mentioned in the first embodiment expect that the oxide at the bottom of trench gates is thicker than that of the first embodiment to further reduce the gate charge for power saving.

Briefly, in another preferred embodiment, the present invention disclosed an integrated device formed on a heavily doped substrate comprising a trench MOSFET and a trench Schottky rectifier and in parallel with a trench gate portion. Said trench MOSFET further comprises: a trenched gate surrounded by a source region encompassed in a body region above a drain region disposed on a bottom surface of said substrate; trench contacts filled with tungsten plugs to connect all said source region with a metal of Al Alloys or Copper serving as source metal by a layer of Ti Silicide/TiN or Co Silicide/TiN deposited along the sidewall of each contact trench; a region heavily doped with dopant different from the source dopant underneath said contact trench to further reduce the resistance between said source region and said body region. The trench Schottky rectifier device further comprises: trenched gates penetrating into a drift region built on said substrate; contact trenches and P+ region at the bottom of each contact trench introduced in the same step with those of trench MOSFET; a layer of Ti Silicide/TiN or Co Silicide/TiN along the sidewall of each trench like that of trench MOSFET but acting as the anode of Schottky rectifier; said metal layer along the side wall of each trench is connect to said layer of Al Alloys or Copper which serving as the source metal in trench MOSFET. What should be noticed is that, contrast to the first embodiment, the trench gate in Schottky rectifier introduced in the third embodiment is not shorted with anode via trench contact like the first embodiment, and trench MOSFET and trench Schottky barrier rectifier have common trench gate.

Briefly, in another preferred embodiment, the structure disclosed is the same as structure mentioned in the third embodiment except that the oxide at the bottom of trench gates is thicker than that of the third embodiment to further reduce the gate charge for power saving.

Briefly, in another preferred embodiment, the structure disclosed is the same as structure mentioned in the first embodiment except that there is no P+ region underneath each contact trench in trench Schottky rectifier by using additional P+ mask to block P+ Ion Implantation during fabricating process.

Briefly, in another preferred embodiment, the structure disclosed is the same as structure mentioned in the second embodiment except that there is no P+ region underneath each contact trench in trench Schottky rectifier by using additional P+ mask to block P+ Ion Implantation during fabricating process.

Briefly, in another preferred embodiment, the structure disclosed is the same as structure mentioned in the fifth embodiment except that in trench Schottky rectifier portion, the epitaxial layer grown on the substrate is doped with two different concentration to form double epitaxial layer, and the concentration near the bottom of contact trench in trench Schottky rectifier is higher than that near the bottom of drift region. As the reverse leakage current of Schottky diode is partly dependent on the concentration of the semiconductor, this double epitaxial structure is good to optimize Vf and Ir.

Briefly, in another preferred embodiment, the structure disclosed is the same as structure mentioned in the sixth embodiment except that in trench Schottky rectifier, the epitaxial layer grown on the substrate is doped with two different concentration to form double epitaxial layer, and the concentration near the bottom of contact trench in trench Schottky rectifier is higher than that near the bottom of drift region to optimize Vf and Ir.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE EMBODIMENTS

Figure 1:
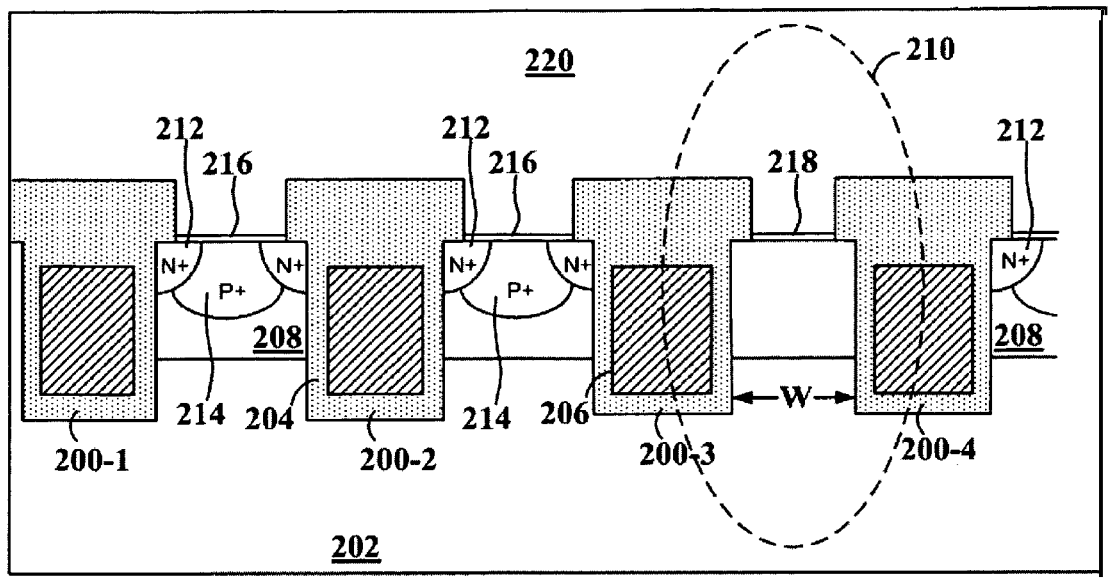
FIG. 1 is a side cross-sectional view of an integrating method of prior art.
Figure 2:
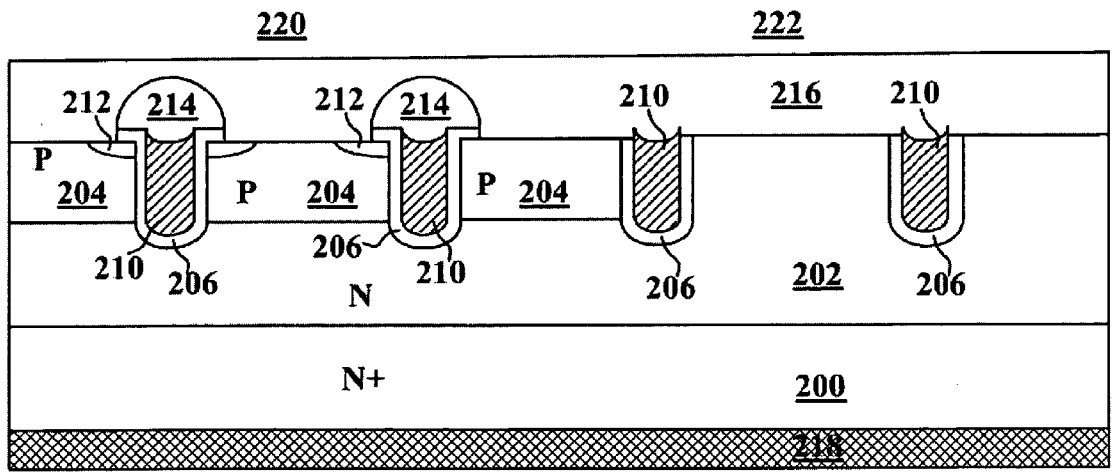
FIG. 2 is a side cross-sectional view of another integrating method of yet another prior art.
Figure 3:
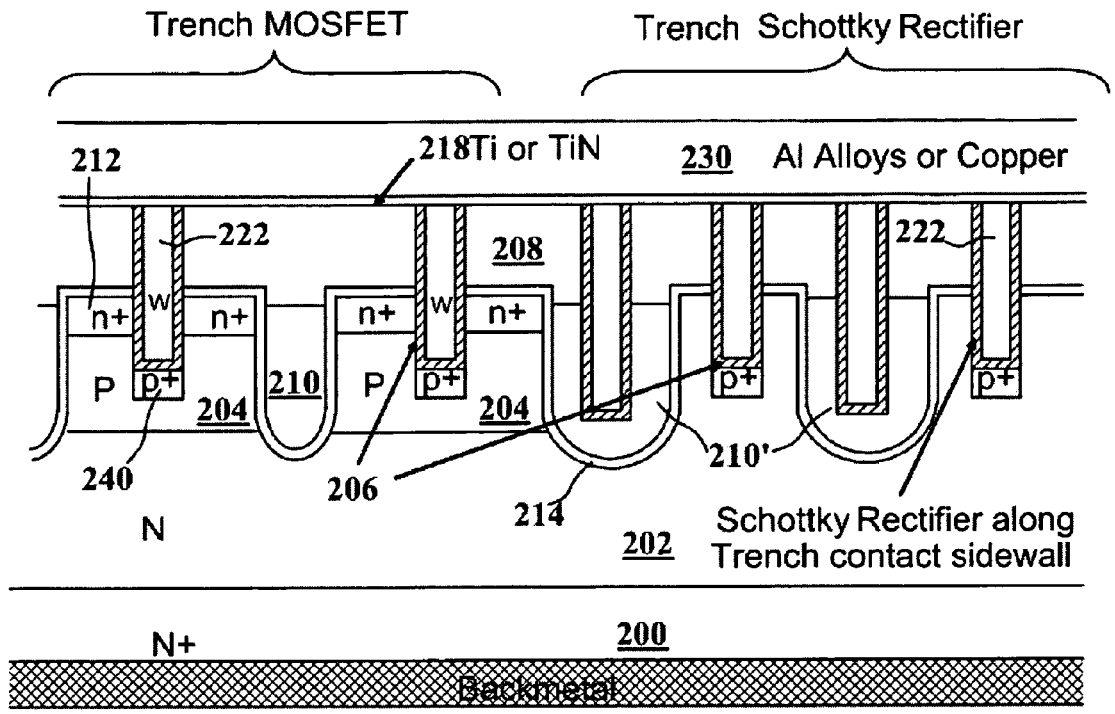
FIG. 3 is a cross-section of an integrated trench MOSFET-Schottky rectifier structure of the first embodiment for the present invention.

Please refer to FIG. 3 for a preferred embodiment of this invention where an integrated MOSFET device and Schottky barrier rectifier device is formed on a heavily N+ doped substrate 200 coated with back metal on rear side as drain, onto which formed an N epitaxial layer 202. The power MOS element further includes a plurality of trenched gates 210 and 210' with a gate insulation layer 214 formed over the walls of the trenches. A body region 204 that is doped with a dopant of second conductivity type, e.g., P-type dopant, extends between the trenched gates expect between those used to form trench Schottky rectifier, and among all trenches, the trenches 210' in Schottky barrier recitifer are wider than those in trench MOSFET. Doped poly is deposited as the gate material with a layer of gate oxide along the sidewall of trenches. Trench contacts are penetrating through source region 212 and into the body region 204 with an area of P+ doped area 240 at the bottom of each trench to reduce the resistance between trench contact metal plug 222 and body region in the trench MOSFET device portion. In Schottky recitifier device portion, trench contacts are used to form Schottky diodes along trench contact sidewall after the formation of a layer of Ti Silicide/ TiN or Co Silicide/TiN along each trench. As mentioned above, the trench contact structure is able to be shrunk to achieve low specific on-resistance for trench MOSFET, and low Vf and Ir for the Schottky diodes. 222 are tungsten plugs filled in contact trenches while 208 is a layer oxide to insulate from the metal layer 218 which is Ti or Ti/N, a layer of Al Alloys or Copper 230 is deposited to serve as the front metal for source and anode. It should be noticed that, the trench gates in Schottky barrier rectifier is not connected with the trench gate in trench MOSFET but shorted with anode.

Figure 4:
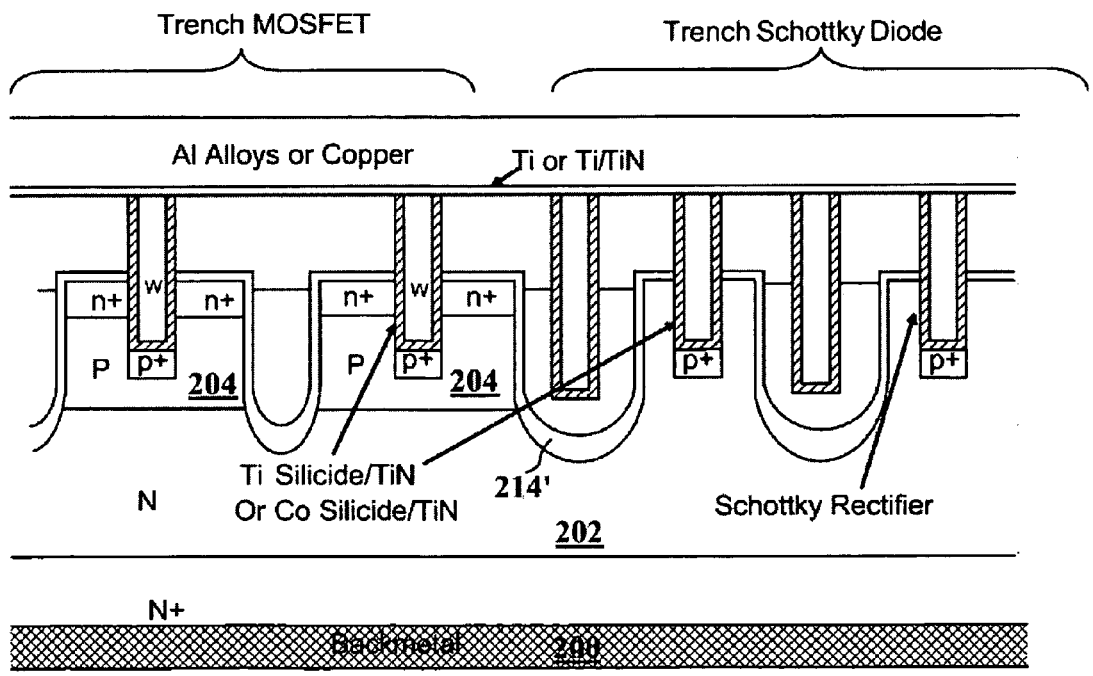
FIG. 4 is a cross-section of an integrated trench MOSFET-Schottky rectifier structure of another embodiment for the present invention.

For the purpose of further reducing the gate charge, a thick bottom oxide structure is designed, as shown in FIG. 4. The structure illustrated is the same as that in FIG. 3 except the bottom of gate oxide layer 214'.

Figure 5:
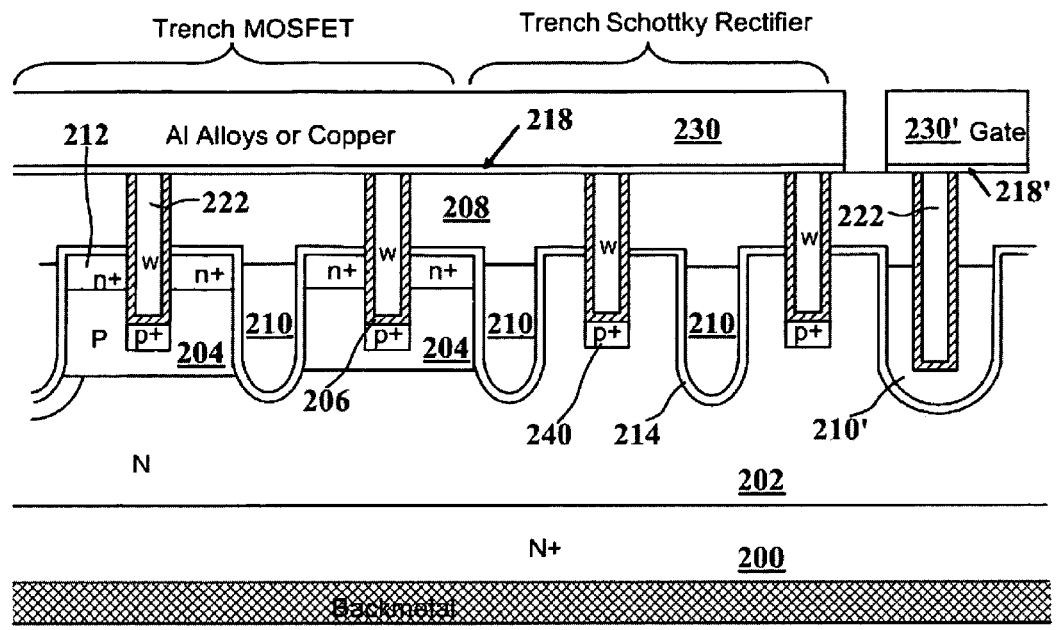
FIG. 5 is a cross-section of an integrated trench MOSFET-Schottky rectifier structure of yet another embodiment for the present invention.

FIG. 5 shows the third preferred embodiment of the present invention, like FIG. 3, structure in FIG. 5 is built in an N doped epitaxial on an N+ doped substrate 200. Trenches 210 and 210' are etched into said epitaxial layer while P doped body region 204 extending between those trenches in trench MOSFET portion. Difference from FIG. 3, trench 210' in FIG. 5 is the common trench gate for gate metal contact shared by trench MOSFET and trench Schottky rectifier having trench width wider than trenches 210. Gate oxide layer 214 is covered along the sidewall of those trenches and on the source region 212 formed at the surface of the substrate. Trench contacts are penetrating through source region 212 and into the body region 204 with an area of P+ doped area 240 underneath each trench to reduce the resistance between source and body region in the trench MOSFET device portion. In Schottky recitifier device potion, trench contacts are used to form Schottky diodes after the formation of a layer of Ti Silicide/TiN or Co Silicide/TiN along each trench. Particularly, trench contact in trench gate 210' is etched to play the gate contact for both trench MOSFET and trench Schottky rectifier. As mentioned above, the trench Schottky structure is able to be shrunk to achieve low specific on-resistance for trench MOSFET. 222 are tungsten plugs filled in contact trenches while 208 is a layer of oxide to insulate from the metal layer 218 and 218' respectively, which is Ti or Ti/N, a layer of Al Alloys or Copper 230 and 230' is deposited to serve as the front metal for source and anode and the gate metal for trench gate, respectively. It should be noticed that, as shown in FIG. 5, the trench gates in Schottky barrier rectifier is not connected with the anode.

Figure 6:
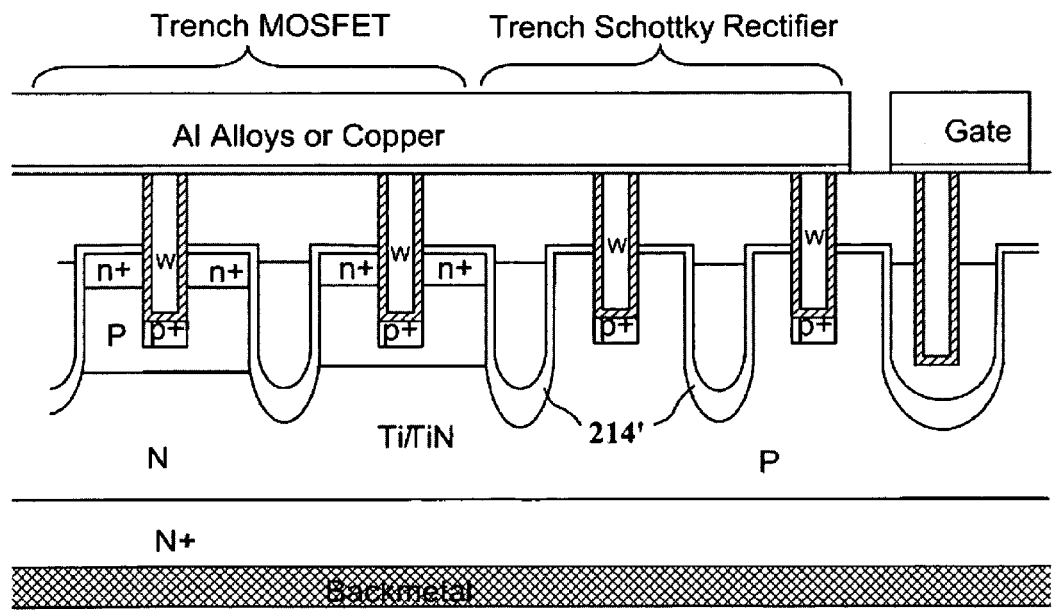
FIG. 6 is a cross-section of an integrated trench MOSFET-Schottky rectifier structure of another embodiment for the present invention.

For the purpose of further reducing the gate charge, a thick bottom oxide structure is designed, as shown in FIG. 6. The structure illustrated is the same as that in FIG. 5 except the bottom of gate oxide layer 214'.

Figure 7:
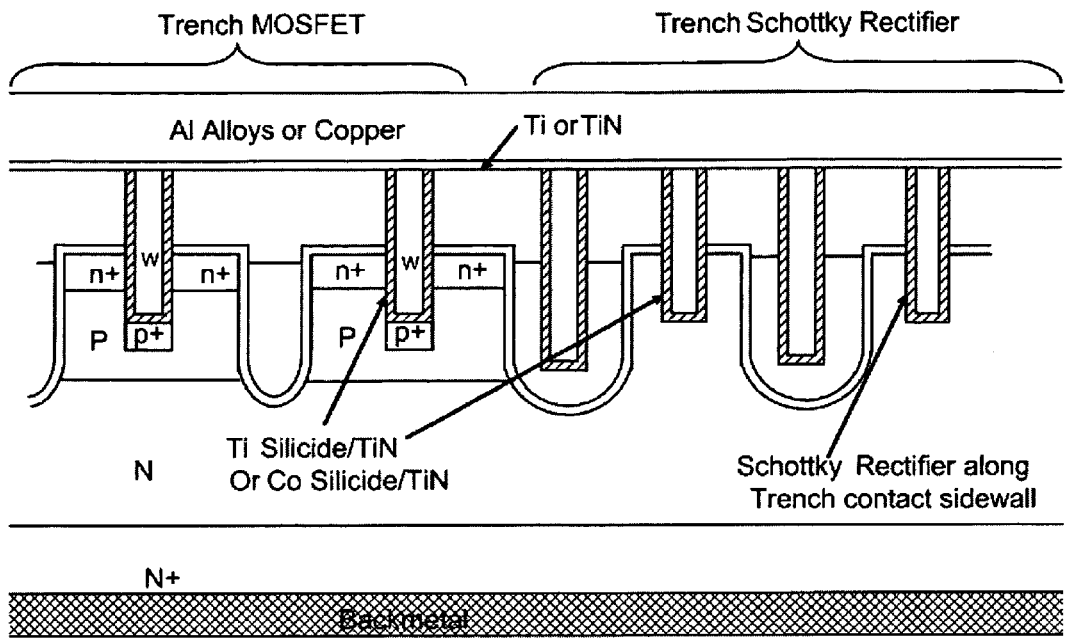
FIG. 7 is a cross-section of an integrated trench MOSFET-Schottky rectifier structure of another embodiment for the present invention.

FIG. 7 shows the fifth preferred embodiment of the present invention. The only difference between FIG. 7 and FIG. 3 is that, there is no P+ area underneath contact trench in trench Schottky rectifier, which can be implemented by using additional P+ mask to block P+ Ion Implantation during diffusion process.

Figure 8:
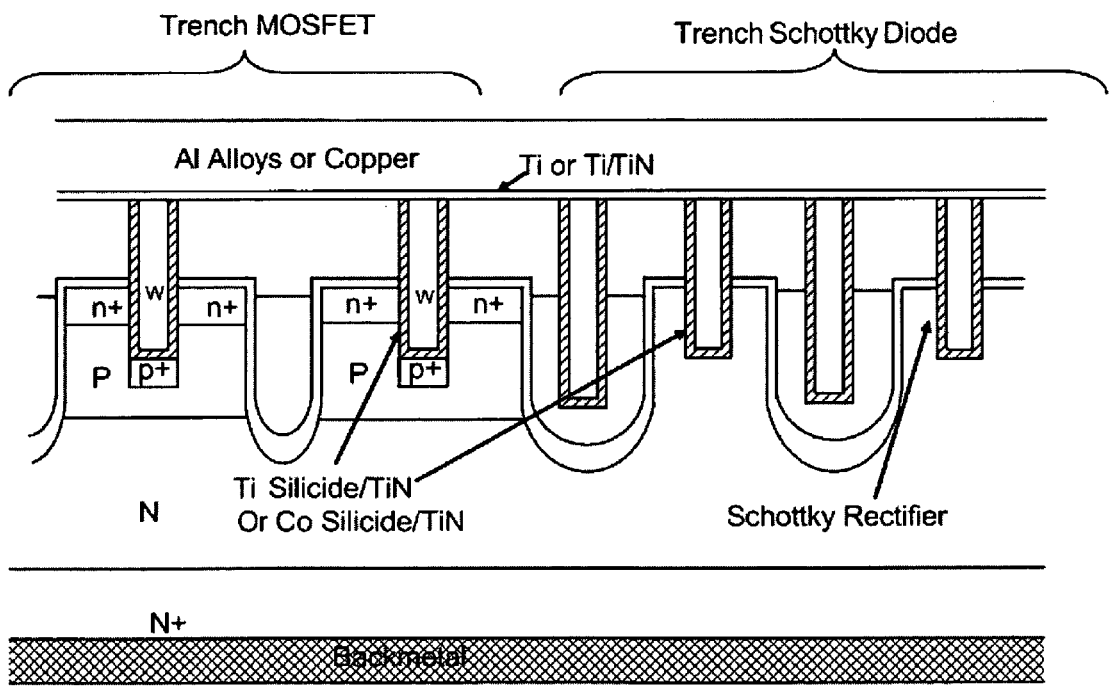
FIG. 8 is a cross-section of an integrated trench MOSFET-Schottky rectifier structure of another embodiment for the present invention.

FIG. 8 shows the sixth preferred embodiment of the present invention. The only difference between FIG. 8 and FIG. 4 is that, there is no P+ area underneath contact trench in trench Schottky rectifier by using additional P+ mask to block P+ Ion Implantation during diffusion process.

Figure 9:
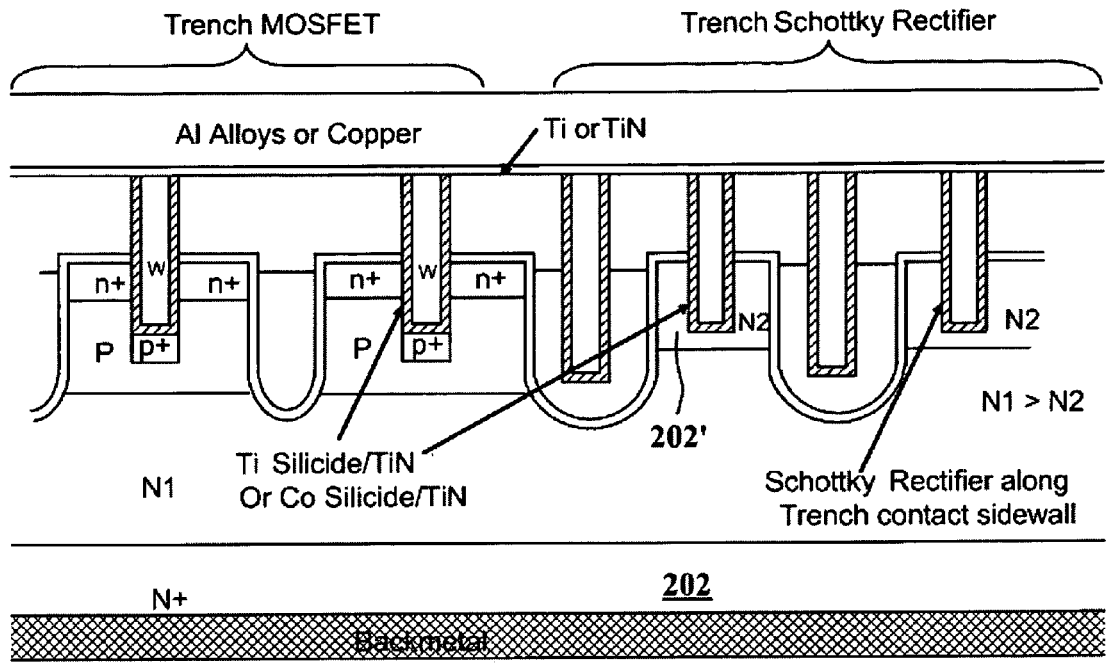
FIG. 9 is a cross-section of an integrated trench MOSFET-Schottky rectifier structure of another embodiment for the present invention.
Figure 10:
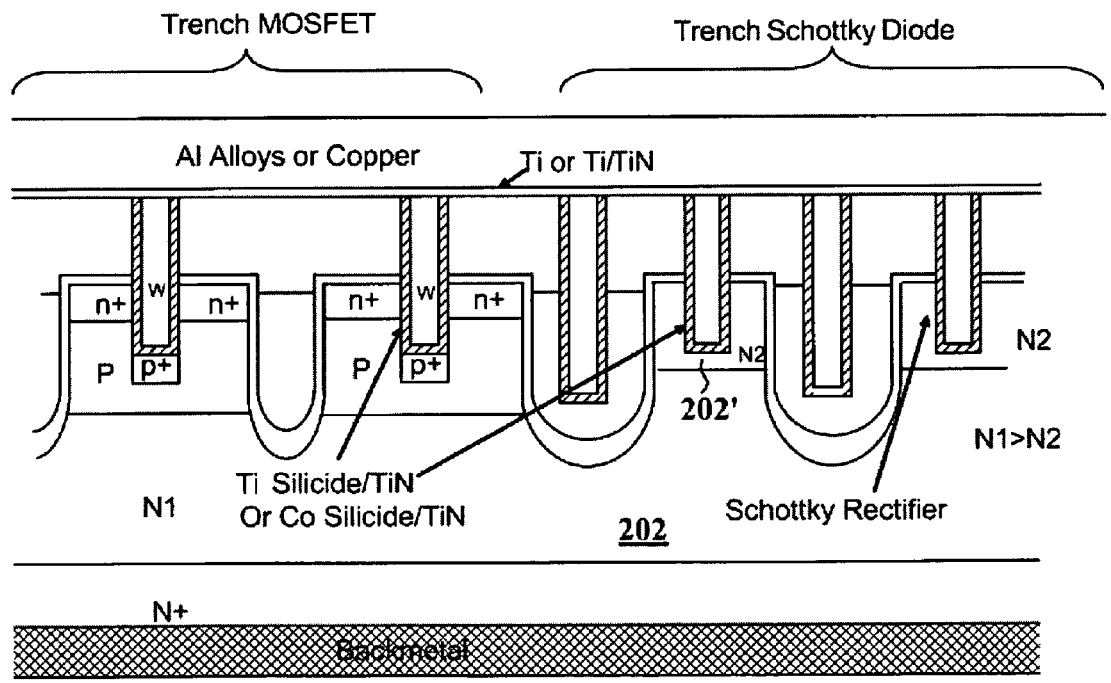
FIG. 10 is a cross-section of an integrated trench MOSFET-Schottky rectifier structure of another embodiment for the present invention.

Compared to FIG. 7, the structure shown in FIG. 9 has a double epitaxial layer in trench Schottky rectifier: epitaxial layer 202 and 202'. Particularly, the concentration of layer 202 is higher than that of 202', for the lower concentration in Schottky diode can further decrease the Vf and the reverse leakage current Ir. Also, the structure shown in FIG. 10 has a double epitaxial layer in trench Schottky rectifier compared to FIG. 8, and the concentration of layer 202 is higher than that of 202' for the reason of reducing Vf and Ir of trench Schottky rectifier.

Figure 11A:
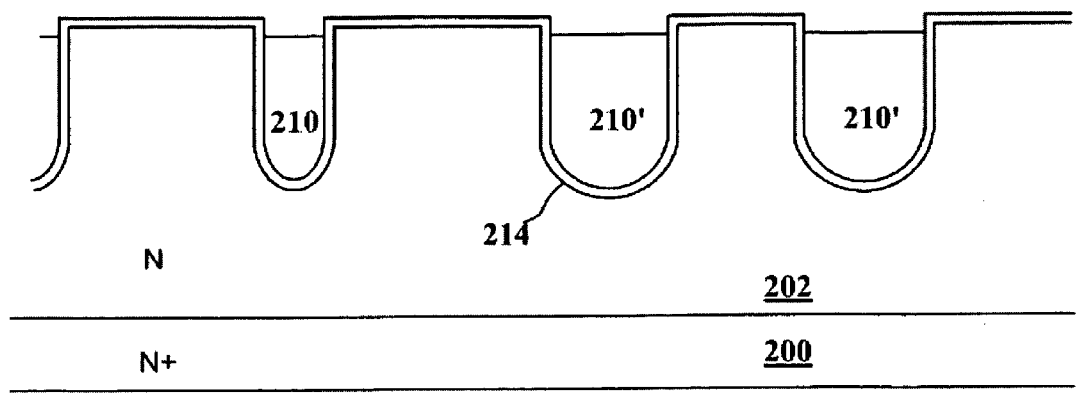
FIG. 11A to 11D are a serial of side cross sectional views for showing the processing steps for fabricating an integrated trench MOSFET-Schottky rectifier structure as shown in FIG. 7.
Figure 11B:
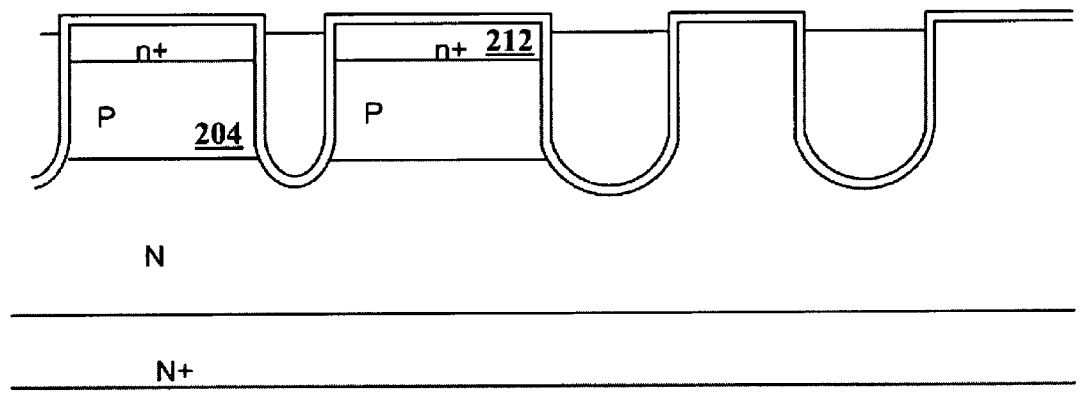

FIGS. 11A to 11D are a series of exemplary steps that are performed to form the inventive device configuration of FIG. 7. In FIG. 11A, an N doped epitaxial layer 202 is grown on an N+ substrate 200 doped. A trench mask is formed by covering the surface of epitaxial layer 202 with an oxide layer, which is then conventionally exposed and patterned to leave mask portions. The patterned mask portions define the trenches 210 for trench MOSFET and 210' for trench Schottky rectifier. Trench 210 and 210' are dry Si etched through the mask opening to a certain depth and trench 210' is wider than 210, then, the mask portion is removed. After the removal, a gate oxide layer 214 is deposited over the entire structure of the element. Next, all trenches are filled with doped poly. Then, the filling-in material is etched back to expose the portion of the gate oxide layer 214 that extends over the surface. After that, in FIG. 11B, a P-body mask is applied to form P-body 204 followed by a step of P-body Ion Implantation, and then the diffusion step for P-body drive-in. Source mask is then used to form source region 212, followed by an N dopant Ion Implantation and diffusion step for source region drive-in.

Figure 11C:
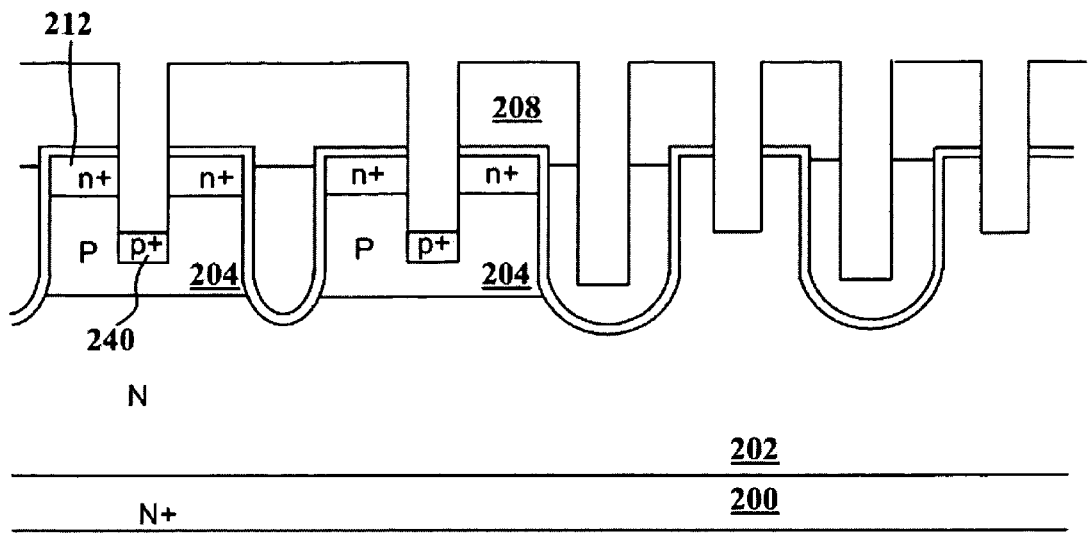

In FIG. 11C, the process continues with the deposition of oxide layer 208 over entire structure. Trench contact mask is applied to carry out a contact etch to open the contact opening by applying a dry oxide etch through the oxide layer 208 and followed by a dry silicon etch to open the contact openings further deeper into the source region 212 and the P-body region 204. After the formation of trench contacts, a P+ mask is used to implement the BF 2 Ion Implantation step to form the P+ area 240 underneath each contact trench.

Figure 11D:
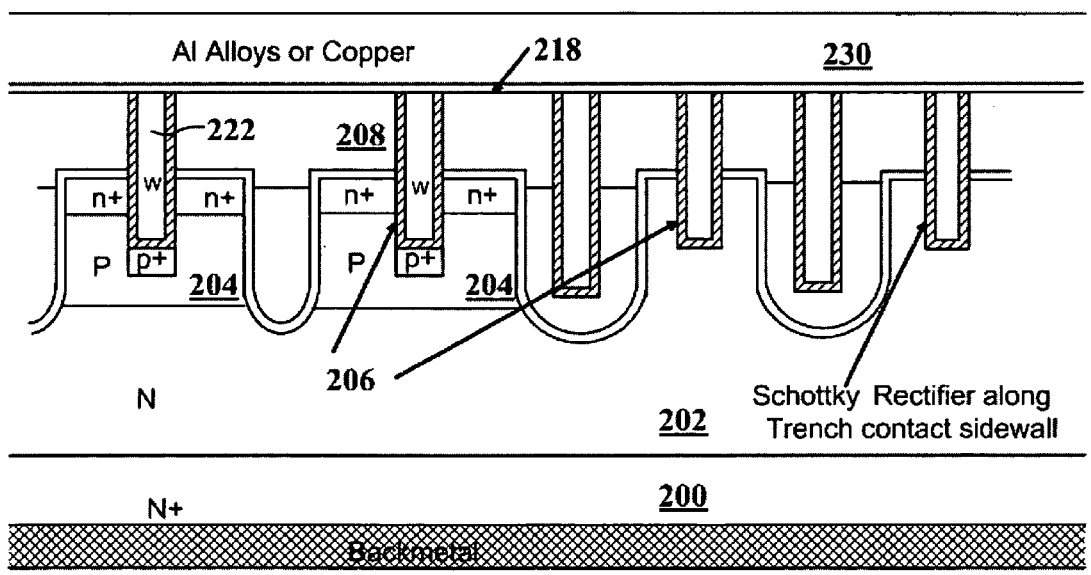

In FIG. 11D, Ti Silicide/TiN or Co Silicide/TiN layer 206 is filled into the trenched contact openings by RTA (730~900° C. for 30 sec). Then the contact plugs 222 composed of tungsten are filled into the trenched contact openings. Then, a tungsten etch back and Ti Silicide/TiN or Co Silicide/TiN etch back is performed followed by the formation of a metal layer of Ti or Ti/TiN 218 on entire structure to connect source region with anode of trench Schottky rectifier. At last, a front metal layer 230 of Al Alloys or Copper is deposited on the surface of metal 208 and a back metal layer on the rear side of substrate to act as source metal and drain metal, respectively.

Although the present invention has been described in terms of the presently preferred embodiments, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

What is claimed is:

1. An integrated circuit comprising a plurality of trench MOSFETs and a plurality of trench Schottky rectifiers horizontally disposed in two different areas further comprising:
   a substrate of first conductivity type;
   an epitaxial layer of said first conductivity type over said substrate, said epitaxial layer having a lower doping concentration than said substrate;
   a trench MOSFET comprising a trenched gate surrounded by a source region of said first conductivity type encompassed in body regions of second conductivity type above a drain region disposed on a bottom surface of said substrate;
   an insulation layer covering said integrated circuit with a source-body contact trench opened in said trench MOSFET through said source and extended into said body regions and filled with a contact metal plug overlying a barrier metal layer therein, said contact metal plug filled in said source-body contact trench connected with a source metal;
   a trench Schottky rectifier formed into said epitaxial layer in a different area from said trench MOSFET and having a Schottky barrier layer lined in a Schottky contact trench penetrating through said insulation layer and extending into said epitaxial layer filled with said contact metal plug overlying said barrier metal layer directly contacting said Schottky contact trench bottom and sidewalls, and between a pair of adjacent trenched gates wherein said source and body regions do not exist, said contact metal plug filled in said Schottky contact trench connected with an anode metal;
   said trenched gates in said trench MOSFET and in said trench Schottky rectifier areas comprising a conductive material surrounded with a gate oxide layer and said trenched gates of said trench MOSFET have a deeper trench depth than said Schottky contact trench into said epitaxial layer;
   said Schottky rectifier formed at least along sidewalls of said Schottky contact trench in said epitaxial layer, separated from said conductive material filled in said pair of adjacent trenched gates by said epitaxial layer and said gate oxide layer without having said source and body regions surrounding said Schottky contact trench sidewalls;
   a gate contact trench opened through said insulation layer and extended into said conductive material having a wider trench width than said trenched gates in said trench MOSFET area, and filled with said contact metal plug overlying a barrier metal layer therein, said contact metal plug filled in said gate contact trench connected with a gate metal; and
   said source metal and said anode metal connected together as a source/anode metal.

2. The integrated circuit of claim 1 wherein said epitaxial layer is a single epitaxial layer.

3. The integrated circuit of claim 1 wherein said trenched gate in said trench MOSFET area is separated from said trenched gate in said trench Schottky rectifier area which is shorted with an anode metal of said trench Schottky rectifier.

4. The integrated circuit of claim 1 wherein said trench MOSFET and said trench Schottky rectifier have common trenched gates which are connected to each other.

5. The integrated circuit of claim 1 wherein said gate oxide layer is single gate oxide layer or double gate oxide layer with a thicker gate oxide on a trench bottom of said trenched gates.

6. The integrated circuit of claim 1 wherein said barrier metal layer lines in said source-body and Schottky contact trenches is Ti/TiN or Co/TiN, 7. The integrated circuit of claim 1 wherein said contact metal plug overlying said barrier metal layer is tungsten.

8. The integrated circuit of claim 1 wherein said Schottky barrier layer comprises $TiSi_2$ (Ti Silicide) or $CoSi_2$ (Co Silicide).

9. The integrated circuit of claim 1 wherein said source/anode metal and gate metal are Ti/Aluminum alloys, Ti/TiN/Aluminum alloys, or Ti/TiN/Copper disposed on top of said insulation layer and said contact metal plug.

10. The integrated circuit of claim 1 wherein said Schottky barrier layer lines along said Schottky contact trench sidewall and bottom.

11. The integrated circuit of claim 1 wherein said Schottky barrier layer lines along only sidewalls of said Schottky contact trench in said epitaxial layer.

12. The integrated circuit of claim 1, wherein said epitaxial layer is a double epitaxial layer with a doping concentration of the top epitaxial layer less than that of the bottom epitaxial layer.

* * * * *